United States Patent [19]
Abe et al.

[11] Patent Number: 5,451,816
[45] Date of Patent: Sep. 19, 1995

[54] INTEGRATED CIRCUIT PACKAGE RECEPTACLE

[75] Inventors: Shunji Abe; Shuuji Kunioka, both of Yokohama, Japan

[73] Assignee: Yamaichi Electronics Co., Ltd., Tokyo, Japan

[21] Appl. No.: 219,367

[22] Filed: Mar. 29, 1994

[30] Foreign Application Priority Data

Mar. 30, 1993 [JP] Japan ................................ 5-095310

[51] Int. Cl.⁶ .................... H01L 23/02; H01L 23/12; H01L 23/16
[52] U.S. Cl. ................................. 257/701; 257/678; 257/697; 257/724; 257/726; 257/727; 257/785
[58] Field of Search ............... 257/693, 696, 697, 723, 257/724, 725, 726, 727, 728, 785, 701, 705, 678

[56] References Cited

U.S. PATENT DOCUMENTS 4,715,823 12/1987 Ezura et al. .
5,045,923 9/1991 Matsuoka .............................. 257/701

*Primary Examiner*—Jerome Jackson
*Assistant Examiner*—Carl Whitehead, Jr.
*Attorney, Agent, or Firm*—Wenderoth, Lind & Ponack

[57] ABSTRACT

An IC package receptacle is disclosed in which, as an actuator is pushed down, a pushing surface thereof pushes down pressure bearing portions of a plurality of contacts against an elastic force to bring the contacts into and out of contact with leads of an IC package. To cope with an increase of the number of contact poles, the pushing load is reduced by providing a plurality of pushing load peaks brought about by different pushing surfaces. The contacts are grouped into a plurality of unit groups of contacts. The individual groups of contacts are pushed by the different pushing surfaces, respectively, thus providing a deviation between pushing load peaks and provided by the pushing surfaces on the respective unit groups of contacts.

11 Claims, 6 Drawing Sheets

INTEGRATED CIRCUIT PACKAGE RECEPTACLE

BACKGROUND OF THE INVENTION

1. Field of the Invention

This invention relates to an integrated circuit (IC) package receptacle, in which with descent of an actuator a plurality of contacts are pushed down to be connected to or released from leads of an IC package.

2. Prior Art

U.S. Pat. No. 4,715,823 discloses an IC package receptacle in which, with descent of an actuator, pressure bearing portions of a plurality of contacts are pushed down by a pushing surface of the actuator against an elastic force to bring the contacts into and out of contact with IC package leads.

In this IC package receptacle, however, all the contacts are pushed down collectively by a single, uniformly shaped pushing surface. Therefore, the pushing load tends to be extremely increased with an increase of the number of IC package lead poles and also of the number of IC package receptacle contact poles.

Usually, the pushing surface for pushing down the pressure bearing portions of the contacts is an inclined surface. In this case, the pushing load (i.e., the operating force required for the actuator to push down all the contacts) varies with the pushing stroke of the actuator as shown by curve L2 in FIG. 10. The curve has a very high peak P2.

SUMMARY OF THE INVENTION

The invention is intended to solve the above problems.

According to the invention, a plurality of pushing load peaks are brought about while the pressure bearing portions of contacts are pushed down against an elastic force by a pushing surface of an actuator with the descent thereof, thus reducing the pushing load.

With a plurality of pushing load peaks brought about while the pressure bearing portions of the contacts are pushed by the pushing surface of the actuator, the required pushing load can be greatly reduced, so that it is possible to cope with a contact pole number increase.

DETAILED DESCRIPTION OF THE INVENTION

A preferred embodiment of the invention will now be described with reference to FIGS. 1 to 10.

Figure 1:
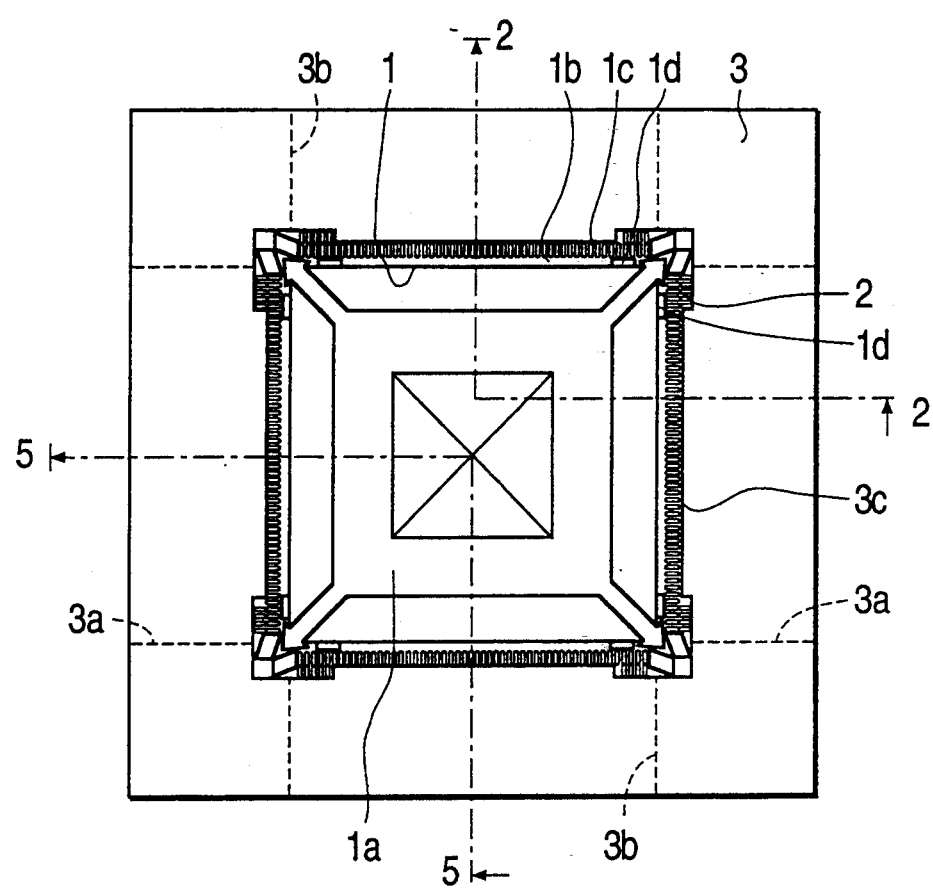
FIG. 1 is a plan view showing an embodiment of the IC package receptacle according to the invention.
Figure 2:
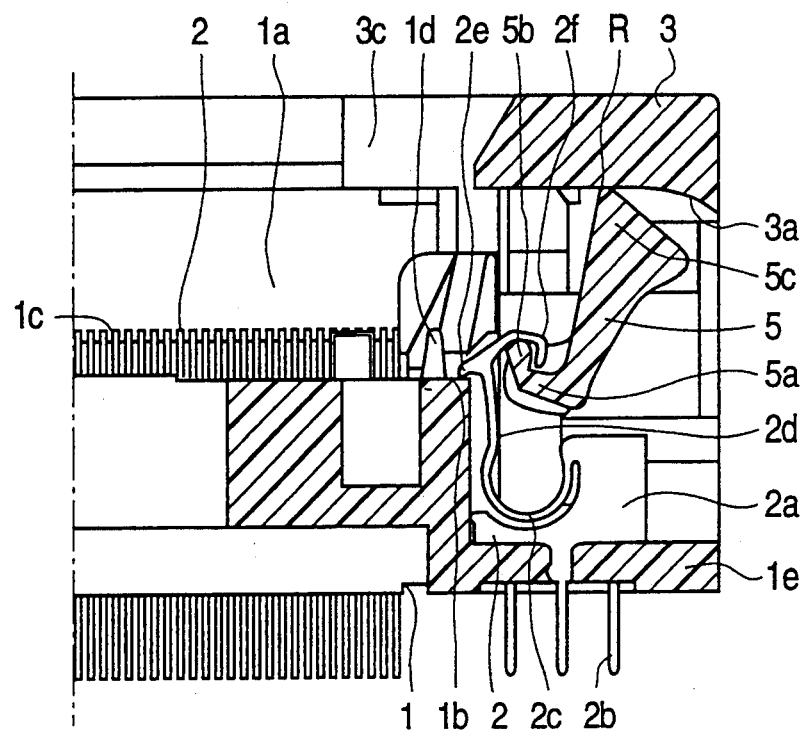
FIG. 2 is a sectional view taken along line 2—2 in FIG. 1.
Figure 3:
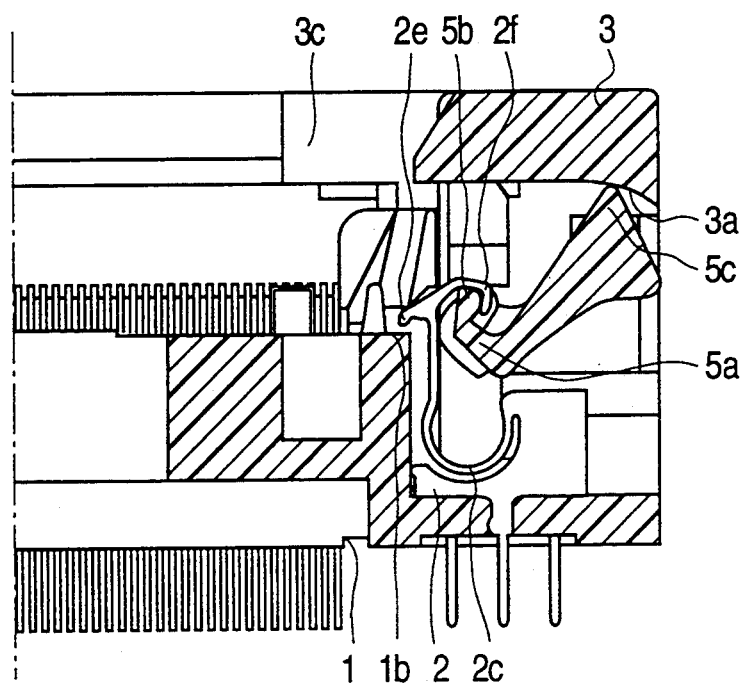
FIG. 3 is a view similar to FIG. 2 but showing the embodiment in a first half stage of actuator descent.
Figure 4:
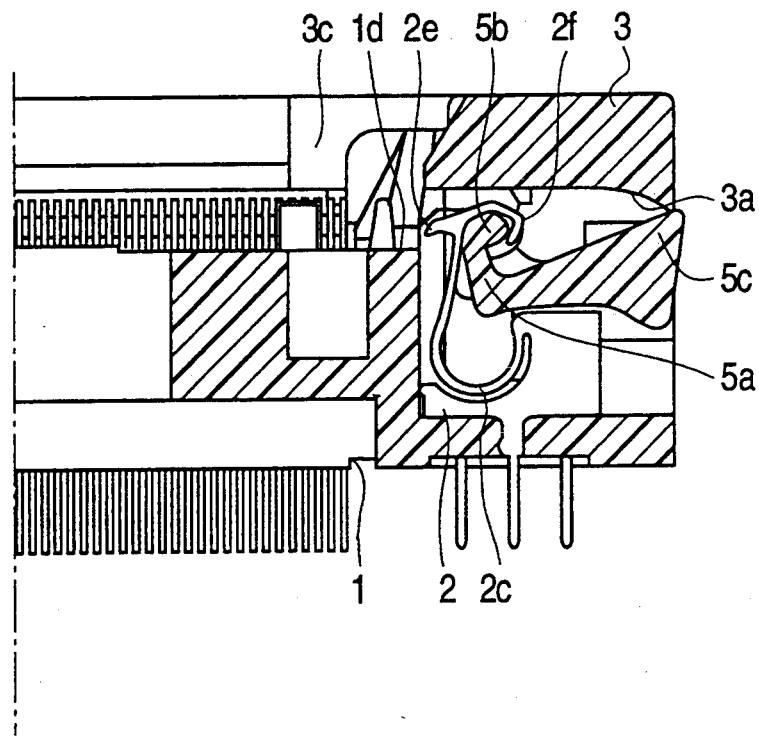
FIG. 4 is a view similar to FIG. 2 but showing the embodiment after the end of descent of the actuator.
Figure 5:
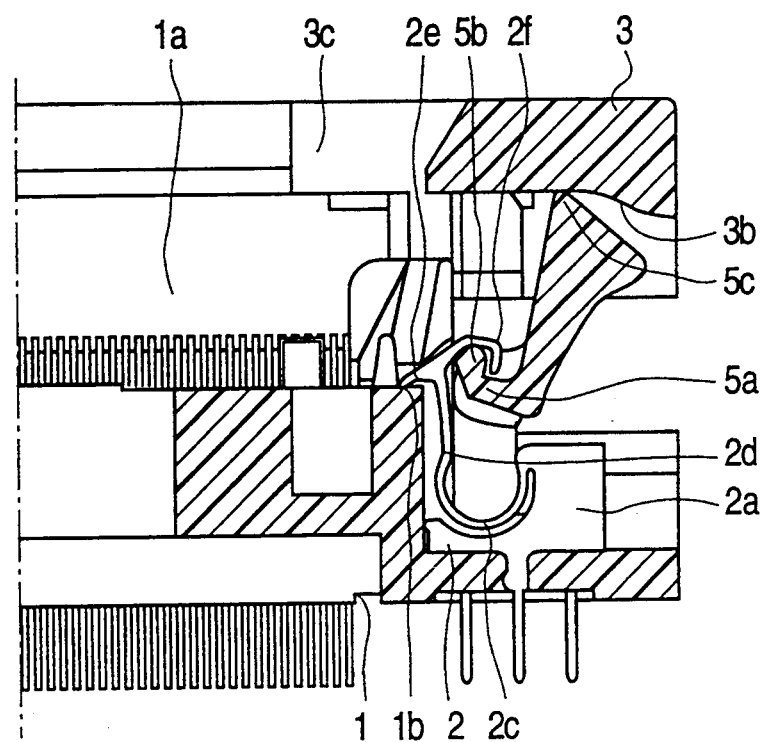
FIG. 5 is a sectional view taken along line 5—5 in FIG. 1.

FIG. 1 is a plan view showing an embodiment of the IC package receptacle according to the invention, FIGS. 2 to 4 are sectional views taken along line 2—2 in FIG. 1, and FIGS. 5 to 7 are sectional views taken along line 5—5 in FIG. 1. FIGS. 2 and 5 correspond to each other, FIGS. 3 and 6 correspond to each other, and FIGS. 4 and 7 correspond to each other. These Figures show states of displacement of contacts corresponding to the extent of descent of the actuator. In the Figures, designated at 1 is a receptacle body, at 2 contacts, and at 3 the actuator.

The receptacle body 1 has a central, substantially square IC accommodation section 1a. The IC package accommodation section 1a has rows of contacts 2 respectively provided along four or two sides thereof. The actuator 3 is provided over the receptacle body 1 such that it can cause forward and rearward displacements of the rows of contacts 2.

Figure 8:
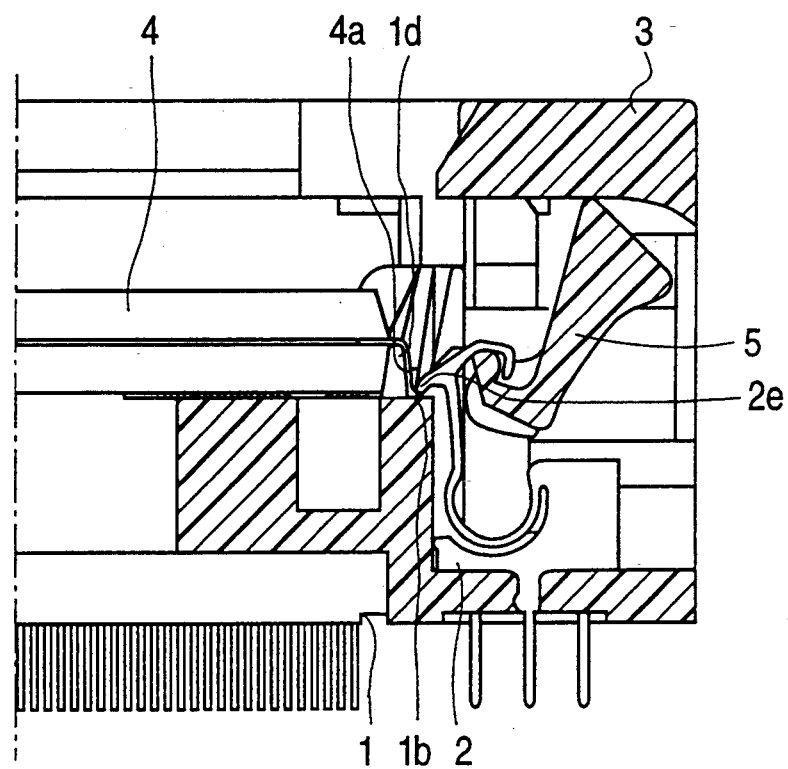
FIG. 8 is a view similar to FIG. 2 but showing the embodiment of the IC package receptacle with the contacts thereof pushed down into contact with leads of a loaded IC package.

On the bottom of the IC package accommodation section 1a, lead support surfaces 1b are provided on the inner side of the rows of contacts 2. The contacts 2 have respective contactor portions 2e, which are insulated from one another such as to be disposed between adjacent ones of many partitioning walls 1c provided on the outer side of the lead support surfaces 1b. The IC package 4, as shown in FIG. 8, has two-step bent Garvin type leads 4a projecting from the sides. The ends of these leads 4a are set on the lead support surfaces to be in contact with the contacts 2. The lead support surfaces 1b have positioning projections 1d provided near the opposite ends for positioning the sides of the IC package 4 with the leads 4a projecting therefrom.

The contacts 2 each have a support portion 2a, which is supported on the top of a contact embedding section 1e of the receptacle body 1 outwardly at the IC package accommodation section 1a, a terminal portion 2b extending from the support portion 2a to extend through the contact embedding section 1e and project from the underside of the receptacle body 1, a curved spring portion 2c extending inwardly of the support portion 2a in a curved fashion, a straight arm portion 2d extending obliquely inwardly and upwardly from the upper end of the curved spring portion 2c, the contactor portion 2e projecting from the upper end of the arm portion 2d toward the associated lead support surface 1b, and a hook portion 2f extending rearwardly from the upper end of the arm portion 2d. A lever 5 is provided for engagement with the hook portion 2f.

The lever 5 is provided for rotation about its fulcrum portion 5a which is found right underneath the hook portion 2f. The lever 5 has one end formed with an engagement portion 5b for engagement with the hook portion 2f and the other end formed with a pressure bearing portion 5c. The pressure bearing portion 5c extends upright beyond the point of engagement between the engagement portion 5b and the hook portion 2f. The lever length of the pressure bearing portion 5c from the fulcrum portion 5a is set to be sufficiently large compared to the length of the engagement portion 5b from the fulcrum portion 5a. The pressure bearing portion 5c has a pressure bearing end R which is located near the top dead center of a circle with the center thereof at the fulcrum portion 5a.

The lower surface of the actuator 3 has either a first or a second pushing surface 3a or 3b. The pushing surfaces 3a and 3b have different shapes and correspond to predetermined ones of the rows of contacts 2, and they are set on the pressure reception ends R of the rows of contacts 2.

Upon the descent of the actuator 3, each of the first and second pushing surfaces 3a and 3b is caused to push down the pressure reception end R of the lever 5 and be displaced rearwardly while pulling the contactor portions 2e of the associated contacts 2 in either row of contacts against the elasticity of the curved spring portion 2c. Conversely, by causing the ascent of the actuator 3, the pushing force applied from the lever 5 to the pressure bearing portion 5c is released, thus causing the contactor portions 2e of the contacts 2 to be displaced obliquely downward or forward by the elasticity of the curved spring portions 2c into contact with the associated lead support surface 1b.

Figure 6:
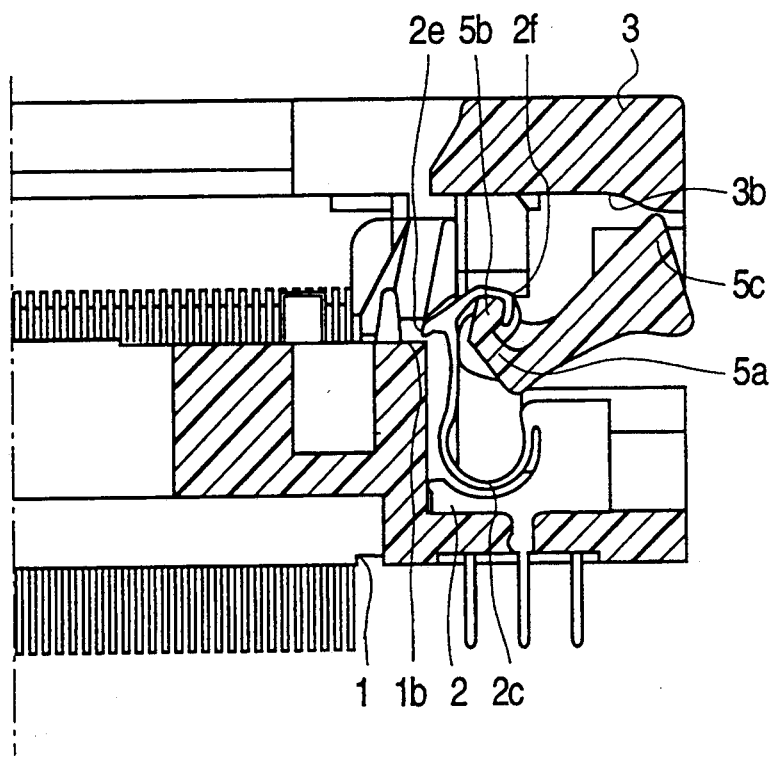
FIG. 6 is a view similar to FIG. 5 but showing the embodiment in the first half stage of actuator descent.
Figure 7:
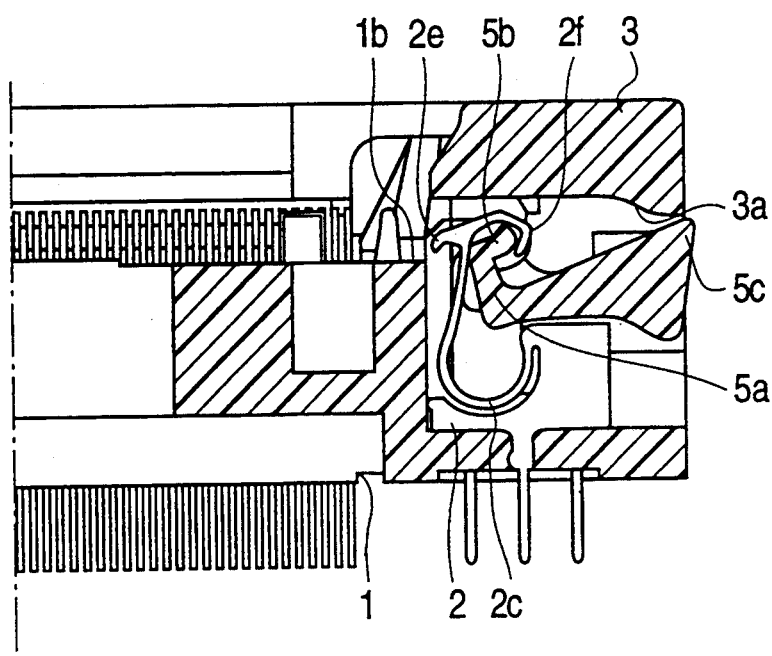
FIG. 7 is a view similar to FIG. 5 but showing the embodiment after the end of descent of the actuator.

In further detail, when the pressure bearing portion 5c of the lever 5 is rotated downward about the fulcrum portion 5a from its state as shown in FIGS. 2 and 5, in which the end of the contactor portions 2e of the contacts 2 are in contact with the lead support surface b and are waiting at positions in which they will interference with the insertion and removal of the IC package, the engagement portions 5b is rotated about the fulcrum portion 5a toward the top dead center. Thus, the hook portion 2f of the contact 2 is pulled obliquely upward to separate the contactor portion 2e from the lead support surface 1b, as shown in FIGS. 3 and 6. As the engagement portions 5b is rotated beyond the top dead center as shown in FIGS. 4 and 7, the hook 2f is pulled sideways. With the obliquely upward and sideways pull by the engagement portion 5b, the contactor portion 2e of the contacts 2 are displaced outwardly or rearwardly against the elasticity of the curved spring portions 2c to position free from the interference with the insertion of the IC package 4.

When the force tending to cause downward rotation of the pressure bearing portion 5c of the lever 5 is released in a state as shown in FIGS. 3, 4, 6 and 7, in which the ends of the contactor portions 2e of the contact 2 are spaced apart from the lead support surface 1b, the contactor portions 2e of the contact 2 are displaced inwardly or forwardly by the restoring force of the curved spring portion 2c. The hook portions 2f thus pull the engagement portion 5 and cause upward rotation of the pressure bearing portion 5c about the fulcrum portion 5a, thus bringing the end portion of the contactor portions 2e into contact with the lead support surface 1b as shown in FIGS. 2 and 4.

The lever 5 is provided for each row of contacts 2 extending along each side of the IC package accommodation section 1a.

The actuator 3 has an IC package accommodation window 3c, which is open right over the IC package accommodation section 1a of the receptacle body 1. The first pushing surfaces 3a are formed along two opposed sides of the accommodation window 3c such that they are found right over and face the rows of contacts 2 provided along two opposed sides of the IC package accommodation section 1a. The second pushing surfaces 3b are formed along the other two opposed sides of the accommodation window 3c such that they are found right over and face the rows of contacts 2 provided along the other two opposed sides of the accommodation section 1a.

The extent of push (amount of outward and downward pivoting) of the pressure bearing portion 5c of each lever 5 by each of the first and second pushing surfaces 3a and 3b is changed gradually with changes in the extent of lowering of the actuator 3. More specifically, the extent of the push-down (or pivoting) of each pressure bearing portion 5c by each first pushing surface 3a is different, at each point of the downward progression (i.e., with the lapse of time) of the actuator 3, than the extent of the push-down (or pivoting) of each pressure bearing portion 5c by each second pushing surface 3b.

The difference between the push-down extents noted above may be provided by providing a difference between the inclination angles of the first and second pushing surfaces 3a and 3b or providing different shapes thereto. For example, a small inclination angle may be set for the first pushing surfaces 3a as shown in FIGS. 2 to 4, while setting a large inclination angle for the the second pushing surfaces as shown in FIGS. 5 to 7.

Further, while the pressure bearing portions 5c of the levers 5 are pushed by the first and second pushing surfaces 3a and 3b upon lowering of the actuator 3, the peak point P4 of the pushing load (see curve L4 in FIG. 9) with the rows of contacts 2 corresponding to the second pushing surfaces 3b is brought about earlier than the peak point P2 of the pushing load (see curve L3 in FIG. 9) with the rows of contacts 2 corresponding to the first pushing surfaces 3a. More specifically, the pushing load peak point P4 is brought about by the second pushing surfaces 3b earlier than the pushing load peak point P3 which is brought about by the first pushing surfaces 3a, because the engagement portions 5b of the levers pushed down by the second pushing surfaces 3b reach the top dead center earlier than the engagement portions 5b of the levers 5 pushed down by the first pushing surfaces 3a. As a result, a deviation is present between the pushing load peaks P3 and P4 by the respective first and second pushing surfaces 3a and 3b.

In further detail, with the commencement of lowering of the actuator 3 from the upper set position thereof shown in FIGS. 2 and 5, at which the contactor portions 2e of the rows of contacts 2 are held in contact with the lead support surfaces 1b by the elastic forces of the curved spring portions 2c, the first and second pushing surfaces 3a and 3b of the actuator 3 simultaneously start the pushdown of the pressure bearing portions 5c of the levers 5 present right underneath them. Thus, the pressure bearing portions 5c are rotated downward about the fulcrum portions 5a against the elasticity of the curved spring portions 2c of the rows of contacts 2. As a reaction, the engagement portions 5a of the levers 5 are rotated upward about the fulcrum portions 5a to pull the hook portions 2f of the rows of contacts 2 obliquely upward. With the obliquely upward pull of the hook portions 2f, the curved spring portions 2c are elastically deformed. As a result, the contact portions 2e of the rows of contacts 2 are rearwardly displaced in an obliquely upward direction to be separated upward from the lead support surfaces 1b, as shown in FIGS. 3 and 6.

In the first half of the descent of the actuator 3 to the position as shown in FIGS. 3 and 6, the second pushing surfaces 3b cause more downward rotation of the pressure bearing portions 5c of the associated levers 5 as shown in FIG. 6 than the first pushing surfaces 3a do as shown in FIG. 3. In consequence, the pushing load provided by the second pushing surfaces 3b corresponding to changes in the extent of push-down of the actuator 3, reaches the peak point P4 as shown in FIG. 9 earlier, while the pushing load provided by the first pushing surfaces 3A corresponding to the extent of push-down by the actuator 3 is increasing prior to the peak point P3 as shown in FIG. 9.

In the second half of the descent of the actuator 3, the first pushing surfaces 3a cause more downward rotation of the pressure bearing portions 5c of the associated levers 5. In consequence, the pushing load provided by the first pushing surfaces 3a corresponding to changes in the extent of push-down of the actuator 3, reaches the peak point P3 as shown in FIG. 9 later, while the pushing load provided by the second pushing surfaces 3b corresponding to changes in the extent of push-down by the actuator 3 is reducing after the peak point P4, as shown in FIG. 9, has been passed.

Figure 9:
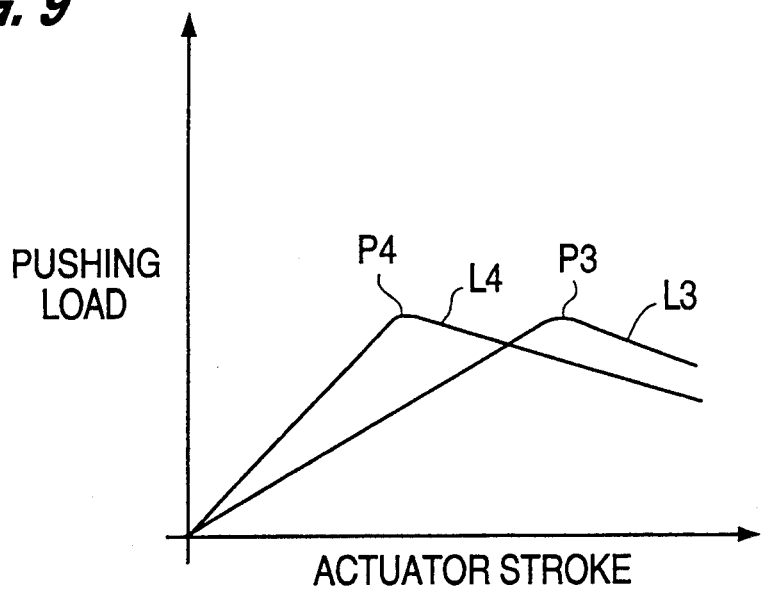
FIG. 9 is a graph showing pushing loads provided by first and second pushing surfaces, plotted against actuator stroke, obtained with the embodiment.

From the beginning to the end of the descent of the actuator 3, the pushing loads provided by the first and second pushing surfaces 3a and 3b are as shown in FIG. 9, with the peak point P4 of the pushing load provided by the second pushing surfaces 3b brought about earlier than the peak point P3 of the pushing load provided by the first pushing surfaces 3a. That is, a plurality of peak points (i.e. the peak points P3 and P4) of the pushing load are brought about by the first and second pushing surfaces 3a and 3b.

Figure 10:
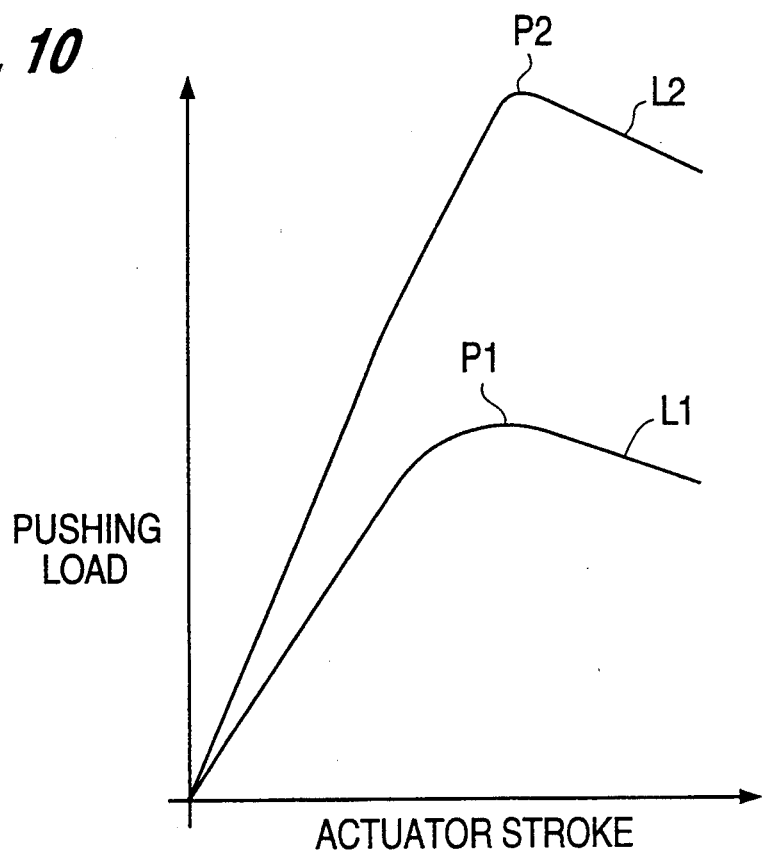
FIG. 10 is a graph showing pushing loads obtained in the prior art and with the embodiment, plotted against actuator stroke.

The sum of the pushing load curves L3 and L4 provided by the first and second pushing surfaces 3a and 3b as shown in FIG. 9 is shown as the pushing load curve L1 in FIG. 10. Considering the pushing load curve L1 provided by the actuator 3 in this embodiment and the pushing load curve L2 of a prior art actuator as shown in FIG. 10, the peak point P1 of the pushing load provided by the actuator 3 in this embodiment is at a level which is much lower than that of the peak point P2 in the prior art. It is thus obvious that the pushing load by the actuator 3 in this embodiment can be greatly reduced comared to the prior art pushing load.

To load the IC package 4, from a waiting state in which the contactor portions 2e of the rows of contacts 2 in contact with the lead support surfaces 1b, the actuator 3 is lowered to cause the first and second pushing surfaces 3a and 3b thereof to push the pressure bearing portions 5c of the levers 5 to cause rearward displacement of the contactor portions 2e of the rows of contacts 2 against the elasticity of the curved spring portions 2c so as to cause displacement of the contactor portions 2e to positions free from interference with the insertion of the IC package 4. In this state, the IC package 4 is inserted into the IC package accommodation section 1a from the IC package accommodation window 3c of the actuator 3, thus setting leads 4a of the IC package 4 on the lead support surfaces 1b. Then, the force with which the actuator 3 is being pushed down is released, whereby the contactor portions 2e of the rows of contacts 2 are displaced inward, i.e., forward, into forced contact with the top surface of the leads 4a of the IC package 4, as shown in FIG. 8, by the restoring forces of the curved spring portions 2c. At this time, the restoration of the curved spring portions 2c is restricted by an amount corresponding to the thickness of the leads 4a of the IC package 4, and thus a sufficient force of pressure contact can be obtained.

To remove the IC package 4, the actuator 3 is pushed down again. As a result, the first and second pushing surfaces 3a and 3b of the actuator 3 push the pressure bearing portions 5c of the levers 5 to cause outward or rearward displacement of the contactor portions 2e of the rows of contacts 2 against the elasticity of the curved spring portions 2c so as to release contact with the leads 4a. In this way, the restriction of the IC package 4 is released. During the push-down of the pressure bearing portions 5c of the levers 5 by the first and second pushing surfaces 3a and 3b of the actuator 3, a plurality of peaks of the pushing load on the rows of contacts, i.e., the peaks P3 and P4, are brought about by the respective first and second pushing surfaces 3a and 3b, and the sum of the pushing loads provided by the first and second pushing surfaces 3a and 3b can be extremely reduced compared to the pushing load in the case of the prior art.

In the above embodiment, in a deviation is present between the peak points P3 and P4 of pushing loads with respect to the rows of contacts 2 extending along one pair of sides and the other pair of sides of the IC package accommodation section 1a, respectively. According to the invention, however, it is possible to divide each row of contacts 2 into a plurality of groups of contacts and provide different pushing surfaces having different inclination angles and/or shapes to push the respective groups of contacts, thereby providing deviations of the peak points of the pushing loads provided by the different pushing surfaces on the respective groups of contacts.

Further, while in the above embodiment the first and second pushing surfaces 3a and 3b simultaneously begin pushing down against the pressure bearing portions 5c while a deviation present between the peak points P3 and P4 of the pushing loads, it is also possible to provide deviations both between the timings of the beginning of push-down and between the pushing load peaks.

Still further, it is possible to provide the contacts in two rows along two opposed sides of the IC package accommodation section 1a and let one row of contacts be pushed down by a first pushing surface 3a and the other row of contacts pushed down by a second pushing surface 3b.

Yet further, while the above embodiment has concerned with a structure in which the first and second pushing surfaces 3a and 3b of the actuator 3 push down the pressure bearing portions 5c of the levers 5 engaged with the rows of contacts 2, according to the invention it is possible to dispense with the levers 5 and provide, instead, provide the upper end of the arm portion 2d of each contact 2 with a pressure bearing portion like a contilever arm and let these pressure bearing portions be directly pushed down by the first and second pushing surfaces 3a and 3b of the actuator 3.

Moreover, according to the invention it is possible to set a deviation between the peak points P3 and P4 of the pushing loads, which are provided by the first and second pushing surfaces 3a and 3b, by providing different shapes or inclination angles to the pressure bearing portions.

As has been described in the foregoing, according to the invention a plurality of peak points of pushing load are brought about while the pressure bearing portions of groups of contacts are pushed down by pushing surfaces of the actuator, whereby it is possible to greatly reduce the pushing load and effectively cope with an increase of the number of contact poles.

What is claimed is:

1. An integrated circuit package receptacle comprising:
   a receptacle body having an IC accommodation section;
   a plurality of contact groups mounted to said receptacle body outwardly of said IC accommodation section, each contact group comprising at least one contact, and each contact having a spring portion and an IC lead contactor portion resiliently supported by said spring portion for movement between an IC lead engagement position and an IC lead insertion position spaced from said IC lead engagement position in a direction away from said IC accommodation section;
   an actuator movably mounted on said receptacle body for movement between first and second positions, said actuator having a plurality of pushing surfaces aligned with said contact groups, respectively; and
   wherein said pushing surfaces have different shapes relative to one another.

2. An integrated circuit package receptacle as recited in claim 1, wherein
   said pushing surfaces of said actuator comprise means for forcing, upon movement of said actuator from the first position toward the second position, said IC lead contactor portions of said contacts from the IC lead engagement positions toward the IC insertion positions against resilient forces of said spring portions, respectively, such that, at various positions of said actuator between said first and second positions, the IC lead contactor portion of said at least one contact of each of said contact groups is positioned away from said IC lead engagement position thereof by a different amount than other ones of said IC lead contactor portions.

3. An integrated circuit package receptacle as recited in claim 1, wherein
   said pushing surfaces of said actuator comprise means for forcing, upon movement of said actuator from the first position toward the second position, said IC lead contactor portions of said contacts from the IC lead engagement positions toward the IC insertion positions against resilient forces of said spring portions, respectively, such that peak loads applied by said pushing surfaces against said contact groups, respectively, occur at respectively different times during movement of said actuator from said first position toward said second position.

4. An integrated circuit package receptacle as recited in claim 1, further comprising
   levers movably interposed between said pushing surfaces and said contact groups respectively aligned therewith.

5. An integrated circuit package receptacle as recited in claim 4, wherein
   each of said levers includes an engagement portion for engagement with said at least one contact of a respective one of said contact groups, and a bearing portion which contacts with a respective one of said pushing surfaces of said actuator during movement of said actuator from said first position toward said second position.

6. An integrated circuit package receptacle comprising:
   a receptacle body having an IC accommodation section;
   a plurality of contact groups mounted to said receptacle body outwardly of said IC accommodation section, each contact group comprising at least one contact, and each contact having a spring portion and an IC lead contactor portion resiliently supported by said spring portion for movement between an IC lead engagement position and an IC lead insertion position spaced from said IC lead engagement position in a direction away from said IC accommodation section;
   an actuator movably mounted on said receptacle body for movement between first and second positions, said actuator having a plurality of pushing surfaces aligned with said contact groups, respectively; and
   wherein said pushing surfaces of said actuator comprise means for forcing, upon movement of said actuator from the first position toward the second position, said IC lead contactor portions of said contacts from the IC lead engagement positions toward the IC insertion positions against resilient forces of said spring portions, respectively, such that, at various positions of said actuator between said first and second positions, the IC lead contactor portion of said at least one contact of each of said contact groups is positioned away from said IC lead engagement position thereof by a different amount than other ones of said IC lead contactor portions.

7. An integrated circuit package receptacle as recited in claim 6, further comprising
   levers movably interposed between each of said pushing surfaces and said contact groups respectively aligned therewith.

8. An integrated circuit package receptacle as recited in claim 7, wherein
   each of said levers includes an engagement portion for engagement with said at least one contact of a respective one of said contact groups, and a bearing portion which contacts with a respective one of said pushing surfaces of said actuator during movement of said actuator from said first position toward said second position.

9. An integrated circuit package receptacle comprising:
   a receptacle body having an IC accommodation section;
   a plurality of contact groups mounted to said receptacle body outwardly of said IC accommodation section, each contact group comprising at least one contact, and each contact having a spring portion and an IC lead contactor portion resiliently supported by said spring portion for movement between an IC lead engagement position and an IC lead insertion position spaced from said IC lead engagement position in a direction away from said IC accommodation section;
   an actuator movably mounted on said receptacle body for movement between first and second positions, said actuator having a plurality of pushing surfaces aligned with said contact groups, respectively; and
   wherein said pushing surfaces of said actuator comprise means for forcing, upon movement of said actuator from the first position toward the second position, said IC lead contactor portions of said contacts from the IC lead engagement positions toward the IC insertion positions against resilient forces of said spring portions, respectively, such that peak loads applied by said pushing surfaces against said contact groups, respectively, occur at respectively different times during movement of said actuator from said first position to said second position.

10. An integrated circuit package receptacle as recited in claim 9, further comprising levers movably interposed between said pushing surfaces and said contact groups respectively aligned therewith.

11. An integrated circuit package receptacle as recited in claim 10, wherein
each of said levers includes an engagement portion for engagement with said at least one contact of a respective one of said contact groups, and a bearing portion which contacts with a respective one of said pushing surfaces of said actuator during movement of said actuator from said first position toward said second position.

* * * * *